United States Patent
Takase

(10) Patent No.: US 8,446,749 B2
(45) Date of Patent: *May 21, 2013

(54) RESISTANCE CHANGE MEMORY DEVICE

(75) Inventor: Satoru Takase, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/407,001

(22) Filed: Feb. 28, 2012

(65) Prior Publication Data

US 2012/0155148 A1   Jun. 21, 2012

Related U.S. Application Data

(60) Continuation of application No. 12/987,201, filed on Jan. 10, 2011, now Pat. No. 8,144,494, which is a division of application No. 12/245,152, filed on Oct. 3, 2008, now Pat. No. 7,885,121.

(30) Foreign Application Priority Data

Oct. 5, 2007   (JP) ................................. 2007-261435

(51) Int. Cl.
*G11C 5/02* (2006.01)

(52) U.S. Cl.
USPC .................. 365/51; 365/46; 365/72; 365/148; 365/175; 365/185.23

(58) Field of Classification Search
USPC .................... 365/51, 46, 72, 148, 175, 185.23
See application file for complete search history.

(56) References Cited

U.S. PATENT DOCUMENTS

| 6,947,315 | B2 | 9/2005 | Iwata |
| 7,154,788 | B2 | 12/2006 | Takemura et al. |
| 7,208,751 | B2 | 4/2007 | Ooishi |
| 7,463,536 | B2 | 12/2008 | Scheuerlein et al. |
| 7,463,546 | B2 | 12/2008 | Fasoli et al. |
| 7,486,587 | B2 | 2/2009 | Scheuerlein et al. |
| 7,525,869 | B2 | 4/2009 | Yan et al. |

(Continued)

FOREIGN PATENT DOCUMENTS

| JP | 2006-514440 | 4/2006 |
| JP | 2006-323924 | 11/2006 |

OTHER PUBLICATIONS

Japanese Office Action issued Apr. 24, 2012, in Japan Patent Application No. 2007-261435 (with English translation).

(Continued)

*Primary Examiner* — Viet Q Nguyen
(74) *Attorney, Agent, or Firm* — Oblon, Spivak, McClelland, Maier & Neustadt, L.L.P.

(57) ABSTRACT

A resistance change memory device including: a cell array having a resistance change type of memory cells disposed at the cross-points of word lines and bit lines, the resistance value of the memory cell being reversibly settable; a word line driver circuit configured to apply a selecting drive voltage to one selected in the word lines; and a bit line driver circuit configured to drive multiple bit lines in such a manner that a set mode and a reset mode are set simultaneously for multiple memory cells selected by the selected word line, the set mode being for changing a selected memory cell from a first resistance state into a second resistance state while the reset mode is for changing a selected memory cell from the second resistance state into the first resistance state.

10 Claims, 7 Drawing Sheets

U.S. PATENT DOCUMENTS

| | | |
|---|---|---|
| 7,542,370 B2 | 6/2009 | Yan et al. |
| 7,885,102 B2 * | 2/2011 | Hanzawa et al. ............. 365/163 |
| 7,885,121 B2 * | 2/2011 | Takase ..................... 365/185.23 |
| 8,144,494 B2 * | 3/2012 | Takase ............................ 365/51 |
| 2006/0197115 A1 | 9/2006 | Toda et al. |
| 2007/0242528 A1 | 10/2007 | Inoue |

OTHER PUBLICATIONS

Y. Hosoi, et al. "High Speed Unipolar Switching Resistance RAM (RRAM) Technology", IEEE International Electron Device Meeting Technical Digest, 2006, 4 pages.

* cited by examiner

| BL \ WL | Write | Mask |
|---|---|---|
| Reset | Reset | Mask |
| Set | Set | Mask |
| Mask | Mask | Mask |

RESISTANCE CHANGE MEMORY DEVICE

CROSS-REFERENCE TO RELATED APPLICATION

This application is a continuation of and claims the benefit of priority under 35 U.S.C. §120 from U.S. Ser. No. 12/987,201 filed Jan. 10, 2011, which is a division of U.S. Ser. No. 12/245,152 filed Oct. 3, 2008 (now U.S. Pat. No. 7,885,121 issued Feb. 8, 2011), and claims the benefit of priority under 35 U.S.C. §119 from Japanese Patent Application No. 2007-261435 filed Oct. 5, 2007, the entire contents of each of which are incorporated herein by reference.

BACKGROUND OF THE INVENTION

1. Field of the Invention

This invention relates to a resistance change memory device.

2. Description of the Related Art

Recently, it is noticed that a resistance change memory (ReRAM) succeeds to a conventional flash memory. The resistance change memory stores a resistance value state as data, which is reversibly changed by applying voltage, current, heat and the like, in the recording layer. The resistance change memory is suitable for shrinking the cell size, and for constituting a cross-point cell array. In addition, it is easy to stack cell arrays.

It is known that a variable resistance element used in a ReRAM has two types of operation modes. One is a bipolar type. In this type of ReRAMs, a high resistance state and a low resistance state are selectively set by exchanging the polarity of applying voltage. The other is a unipolar type. In this type of ReRAMs, it is possible to selectively set a high resistance state and a low resistance state by controlling the voltage applying time without exchanging the polarity of the applying voltage (for example, refer to Y. Hosoi et al, "High Speed Unipolar Switching Resistance RAM (RRAM) Technology" IEEE International Electron Devices Meeting 2006, Technical Digest, P. 793-796).

In the unipolar type of ReRAMs with a cross-point type of cell array, two operations are settable in accordance with combinations of voltages and applying times thereof as follows: one is for obtaining a low resistance value state from a high resistance value state (i.e., set or write operation); and the other is for obtaining a high resistance value state from a low resistance value state (i.e., reset or erase operation). Therefore, it is difficult to make a cell be in a set operation mode and make another cell be in a reset operation mode simultaneously, within plural cells selected by a selected word line.

With respect to a ReRAM having a cross-point type of cell array, there has already been proposed such a write scheme that identical data are written in multiple bits as data pattern used for estimating the memory function (for example, refer to JP-A-2006-323924).

SUMMARY OF THE INVENTION

According to an aspect of the present invention, there is provided a resistance change memory device including:

a cell array having a plurality of word lines disposed in parallel, a plurality of bit lines disposed to cross the word lines and a resistance change type of memory cells disposed at the cross-points of the word lines and the bit lines, the resistance value of the memory cell being reversibly settable;

a word line driver circuit configured to apply a selecting drive voltage to one selected in the word lines; and a bit line driver circuit configured to drive multiple bit lines in such a manner that a set mode and a reset mode are set simultaneously for multiple memory cells selected by the selected word line, the set mode being for changing a selected memory cell from a first resistance value state into a second resistance value state while the reset mode is for changing a selected memory cell from the second resistance value state into the first resistance value state.

According to another aspect of the present invention, there is provided a resistance change memory device including:

a cell array including a plurality of word lines disposed in parallel, a plurality of bit lines disposed to cross the word lines and a resistance change type of memory cells disposed at the cross-points of the word lines and the bit lines, the resistance value of the memory cell being changed between a set state and a reset state;

a bit line driver circuit configured to select one of a set-use pulse voltage, a reset-use pulse voltage and a mask-use voltage and supply the selected voltages to the respective bit lines; and a word line driver circuit configured to select at least one of the word lines and supply a word line drive pulse voltage to the selected word line, wherein the memory cell is changed from the reset state into the set state under the condition that the set-use pulse voltage and the word line drive pulse voltage are applied simultaneously, and changed from the set state into the reset state under the condition that the reset-use pulse voltage and the word line drive pulse voltage are applied simultaneously, while the memory cell is kept in the present state under the condition that the mask-use pulse voltage and the word line drive pulse voltage are applied simultaneously.

According to still another aspect of the present invention, there is provided a resistance change memory device including:

a cell array including a plurality of first lines disposed in parallel, a plurality of second lines disposed to cross the first lines and a resistance change type of memory cells disposed at the cross-points of the first lines and the second lines, the resistance value of the memory cell being changed between a set state and a reset state;

a first line driver circuit configured to select one of a set-use pulse voltage, a reset-use pulse voltage and a mask-use voltage and supply the selected voltages to the respective first lines; and a second line driver circuit configured to select at least one of the second lines and supply a second line drive pulse voltage to it, wherein the memory cell is changed from the reset state into the set state under the condition that the set-use pulse voltage and the second line drive pulse voltage are applied simultaneously, and changed from the set state into the reset state under the condition that the reset-use pulse voltage and the second line drive pulse voltage are applied simultaneously, while the memory cell is kept in the present state under the condition that the mask-use pulse voltage and the second line drive pulse voltage are applied simultaneously.

DETAILED DESCRIPTION OF THE EMBODIMENTS

Illustrative embodiments of this invention will be explained with reference to the accompanying drawings below.

Embodiment 1

Figure 1:
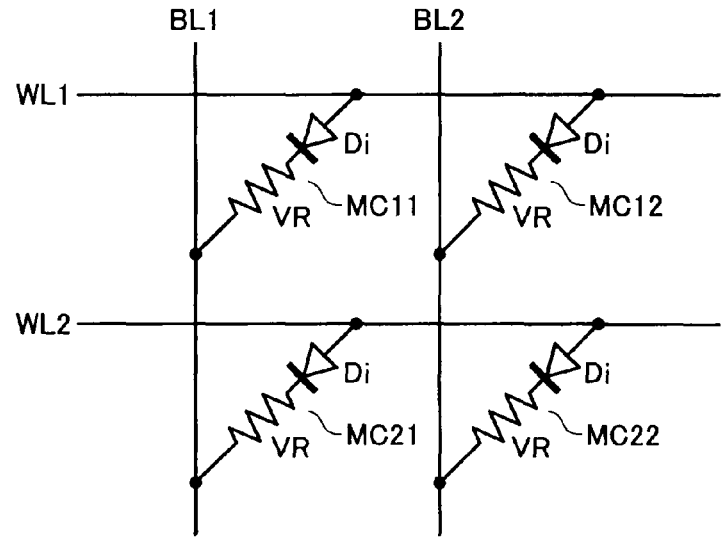
FIG. 1 shows an equivalent circuit of a cell array in a resistance change memory device in accordance with an embodiment.

FIG. 1 shows an equivalent circuit of a cell array of a resistance change memory in accordance with an embodiment. Bit lines BL (BL1, BL2, . . . ) and word lines WL (WL1, WL2, . . . ) are disposed to cross each other, and memory cells MC (MC11, MC12, . . . , MC21, MC22, . . . ) are disposed at the respective cross-points of the bit lines BL and word lines WL.

Memory cell MC is formed of a variable resistance element VR and a diode Di connected in series. Variable resistance element VR stores a resistance value as data in a non-volatile manner, which is reversibly settable with an electrical or thermal process. Although the detailed layout is not shown, for example, diode Di and variable resistance element VR are stacked on word lines WL, and bit lines BL are formed thereon in perpendicular to the word lines WL.

Figure 2:
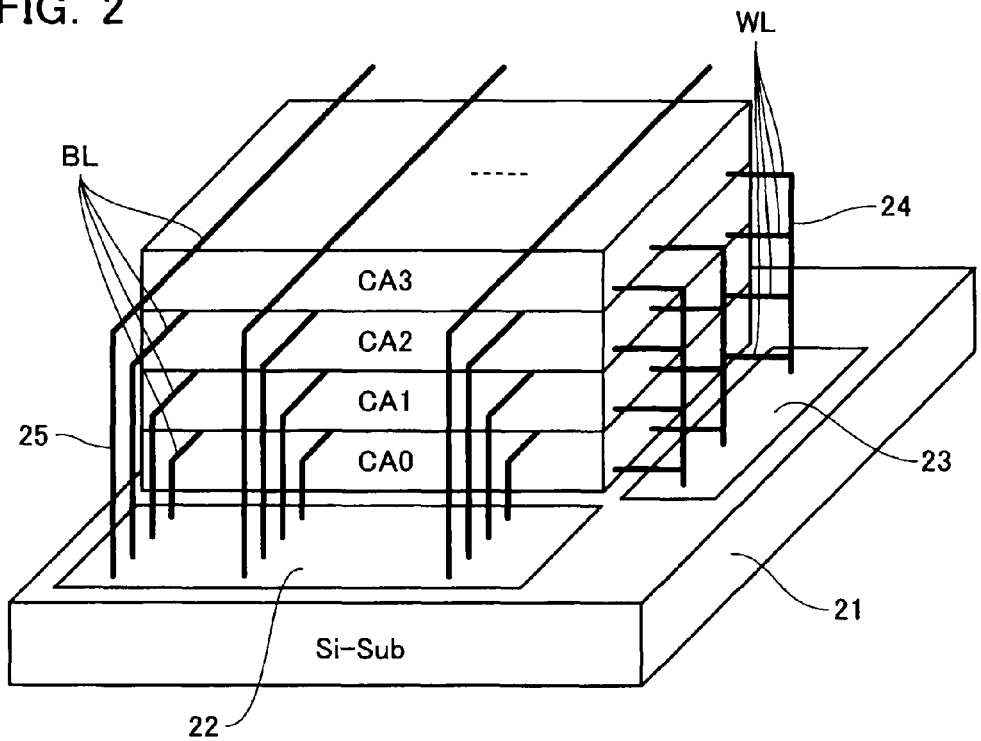
FIG. 2 shows a three-dimensionally stacked cell array.

To achieve a resistance change memory with a large capacity, as shown in FIG. 2, multiple cell arrays are stacked to constitute a three-dimensional (3D-) cell array. In the example shown here, four cell arrays CA0-CA3 are stacked above a silicon substrate 21. Word lines WL in the respective cell arrays are coupled in common to via-wirings 24 and drawn to word line driver circuit 23 formed on the silicon substrate 21. Bit lines BL in the respective cell arrays are coupled independently of each other to bit line select circuit/sense amplifier circuit 22 formed on the silicon substrate 21 through via-wirings 25.

Figure 3:
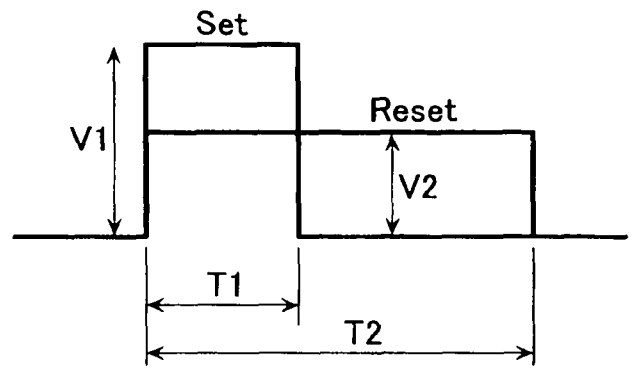
FIG. 3 shows set and reset voltage waveforms applied to the variable resistance element of a memory cell.

Variable resistance element VR has a recoding layer formed of a kind of transition metal oxide. FIG. 3 shows an example of set/reset voltage waveforms used in a unipolar operation of the variable resistance element VR. It is assumed in the variable resistance element VR shown here that a thermally stable high resistance state is referred to as a "reset state", and it may be changed into a low resistance state (i.e., "set state") with a certain voltage V1 applied for a certain time T1 (set operation). By contrast, the variable resistance element VR in the low resistance state may be changed into the high resistance state (i.e., set operation) due to Joule's heat generated in the device based on a large current carried therein when voltage V2 (<V1) is applied for time T2 (>T1).

That is, it is assumed in this example that the set operation of the variable resistance element VR is achieved as a voltage process while the reset operation is achieved as a thermal process. Note here that the definition of the set and reset operations are relative. For example, in accordance with what material is used as the recording layer of the variable resistance element, a low resistance state becomes a thermally stable state, which may be defined as a reset state.

In this embodiment, the set and reset operations explained with reference to FIG. 3 are used basically, and it is made possible to execute set and reset operations simultaneously for multiple memory cells which are arranged on a word line in the cell array configuration shown in FIG. 1.

Figure 4:
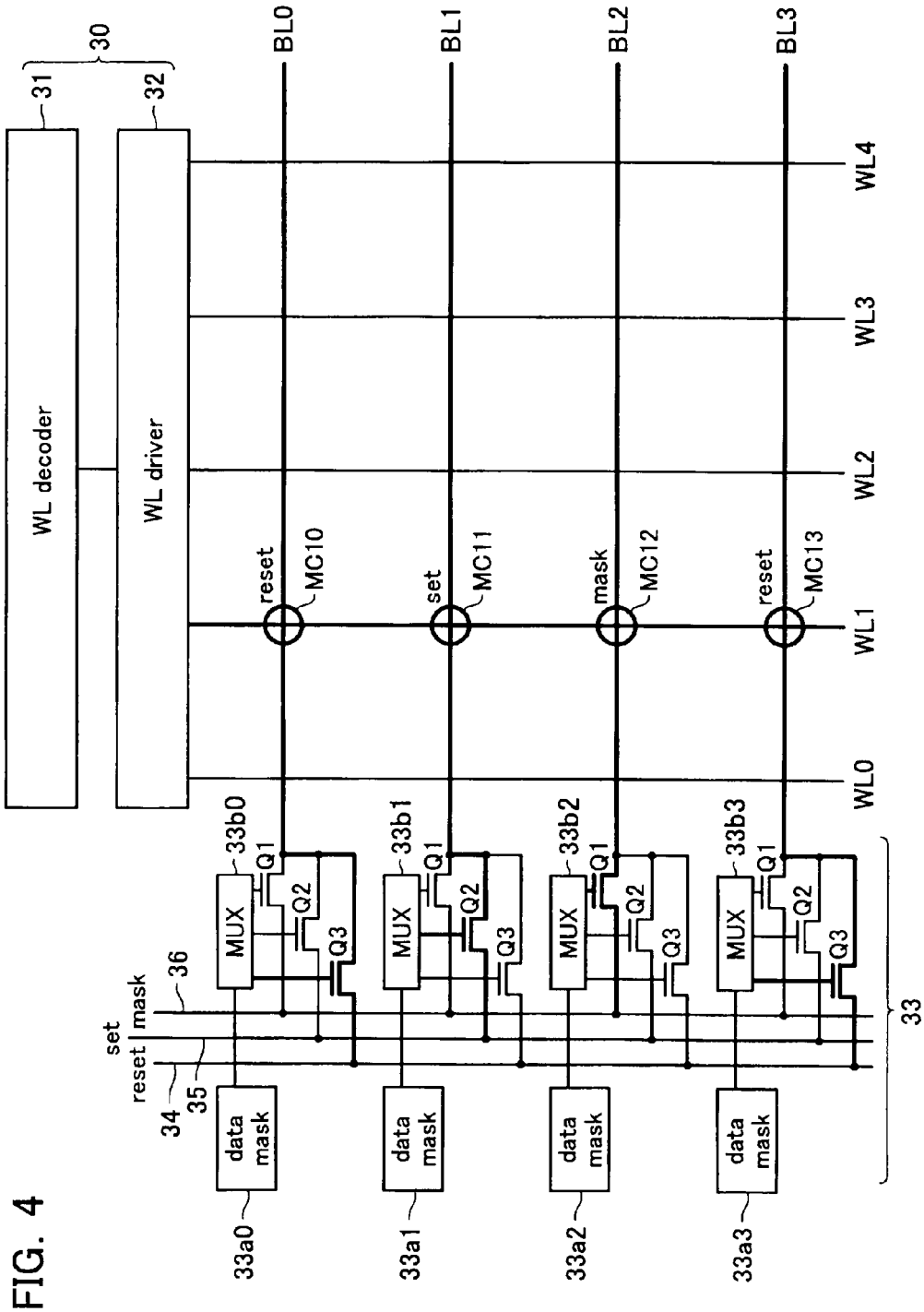
FIG. 4 shows a cell array driver circuit in the embodiment.

FIG. 4 shows a driving circuit of the cell array. Disposed on the side of word lines WLi is a word line driver circuit 30, which has word line decoder 31 for selecting a word line and word line driver 32 for supplying a driving voltage to a selected word line.

Disposed on the side of bit lines BLj is a bit line driver circuit 33 configured to be able to apply a set-use pulse voltage and a reset-use pulse voltage to different cells simultaneously. The bit line driver circuit 33 has data registers 33a (33a0, 33a1, . . . ) disposed for the respective bit lines to store write data, multiplexers 33b (33b0, 33b1, . . . ) controlled by the write data, and transistors Q1-Q3 driven by the outputs of the multiplexers.

One ends of transistors Q1-Q3 are coupled in common to each bit line BLi while the other ends are coupled to mask-use voltage signal line 36, set-use voltage signal line 35 and reset-use voltage signal line 34, respectively. These mode setting voltage signal lines 34-36 are disposed to be shared by the bit lines.

Data register 33a is used as a mode selecting circuit such as to decide which of set and reset operations is adapted to a bit line, or select a mask operation for keeping a memory cell as it is in the present resistance value state. In detail, data register 33a stores write data formed of two bits for designating three operation modes, for example, as follows: (10) designates the set mode; (01) the reset mode; and (11) the mask mode for keeping a cell as it is. In accordance with this write data, multiplexer 33b selectively turns on set-use transistor Q2, reset-use transistor Q3 or mask-use transistor Q1.

FIG. 4 shows such a case that memory cells MC10, MC11, MC13 and MC14 disposed on the bit lines BL0, BL1, BL2 and BL3 are selected by a selected word line WL1 and subjected to reset, set, mask and reset modes, respectively.

Figure 5:
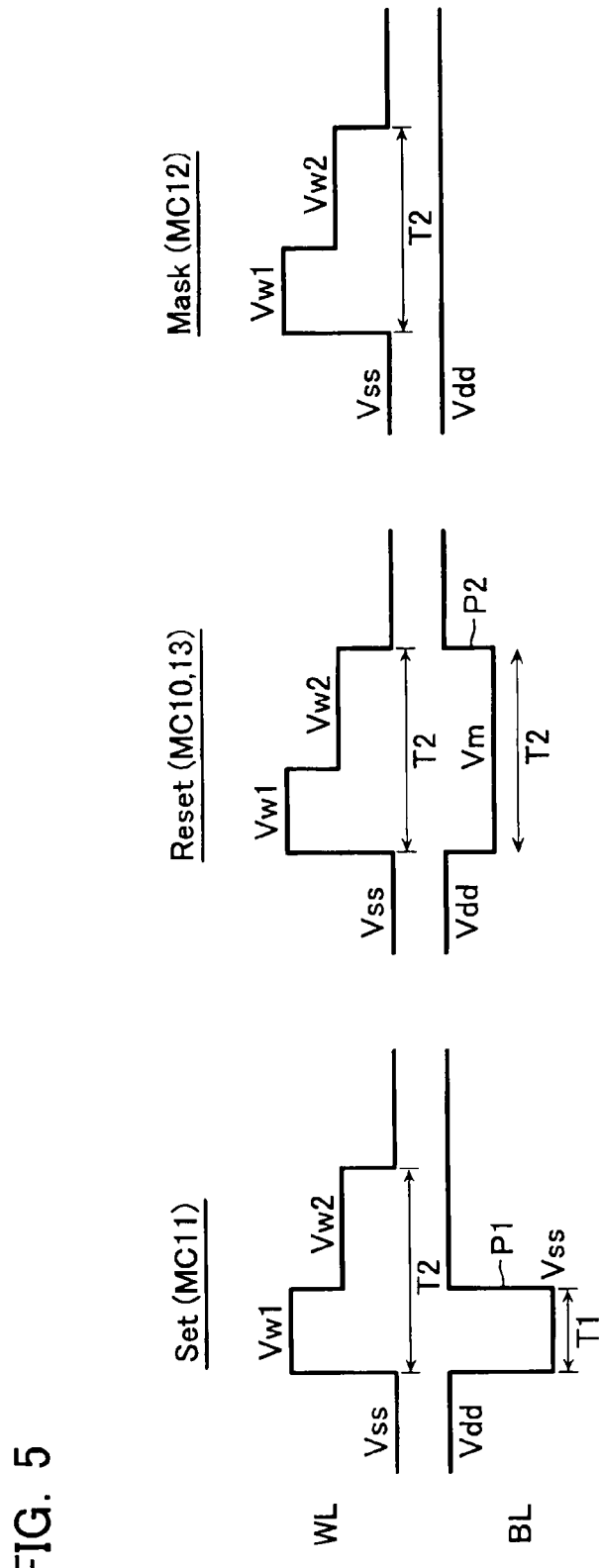
FIG. 5 shows set, reset and mask operations waveforms in the embodiment.

FIG. 5 shows voltage waveforms applied to a selected word line WL and selected bit lines with respect to the respective modes of set, reset and mask operations. The selected word line is selected by the decoder 31 and applied with such a step-shaped voltage that is generated from the driver 32 to be composed of pulse voltage Vw1 with pulse width T1 and pulse voltage Vw2 (<Vw1) stepped-down from Vw1 with pulse width T2 (>T1).

Applied to the set and reset voltage signal lines 35 and 34 are negative pulse (i.e., set-use pulse voltage) P1 with pulse width T1, which swings from the basic level Vdd to Vss, and negative pulse (i.e., reset-use pulse voltage) P2 with pulse width T2, which swings from the basic level Vdd to a medium level Vm (>Vss), respectively. Mask-use signal line 36 is kept at the basic level of the set-use and reset-use pulse, Vdd (i.e., mask-use voltage).

In accordance with data registers 33a, transistor Q2 is turned on for the set mode bit line BL1; transistor Q3 is turned on for the reset mode bit line BL0, BL3; and transistor Q1 is turned on for mask mode bit line BL2, so that these bit lines are applied with set-use pulse P1; reset-use pulse P2; and mask-use voltage Vdd, respectively. It should be noted that transition timings of the word line and the bit lines are made to be synchronized.

Word line and bit line voltages in the set, reset and mask modes are shown in FIG. 5. That is, set mode cell MC11 is applied with voltage Vw1 that is defined as a difference between word line voltage Vw1 and bit line negative pulse P1 (=Vss). Assuming that the forward direction voltage drop of the diode Di of the memory cell is neglected, and the voltage between the word line and the bit line is applied to the variable resistance element VR as it is, memory cell MC11 will be changed into the low resistance state through the voltage process with voltage Vw1 and time T1 set to be in a suitable level and a suitable time length necessary for the set operation.

In the reset mode memory cells MC10 and MC13, the differential voltage applied to the variable resistance element is in a range of (Vw1−Vm)~(Vw2−Vm), and the voltage applying time is T2. Assuming that these voltage and time are set to be in a suitable state necessary for the reset operation, the reset operation will be performed through the heat process for memory cells MC10 and MC13.

In the mask mode memory cell MC12, applied voltage is in a range of (Vw1−Vdd)~(Vw2−Vdd), and the voltage applying time is T2. Assuming that these voltage and time are insufficient for the reset or set operation, memory cell MC12 maintains the present data state as it is.

During the above-described operation, non-selected word lines are kept at Vss. Since the set and reset use negative pulses P1 and P2 applied to bit lines are selected in such levels that set or reset does not occur even if these levels are applied to a bit line, non-selected cells are kept in the present data state.

As described above, according to this embodiment, multiple cells arranged along a selected word line may be subjected simultaneously to set, reset and mask mode.

Embodiment 2

Figure 6:
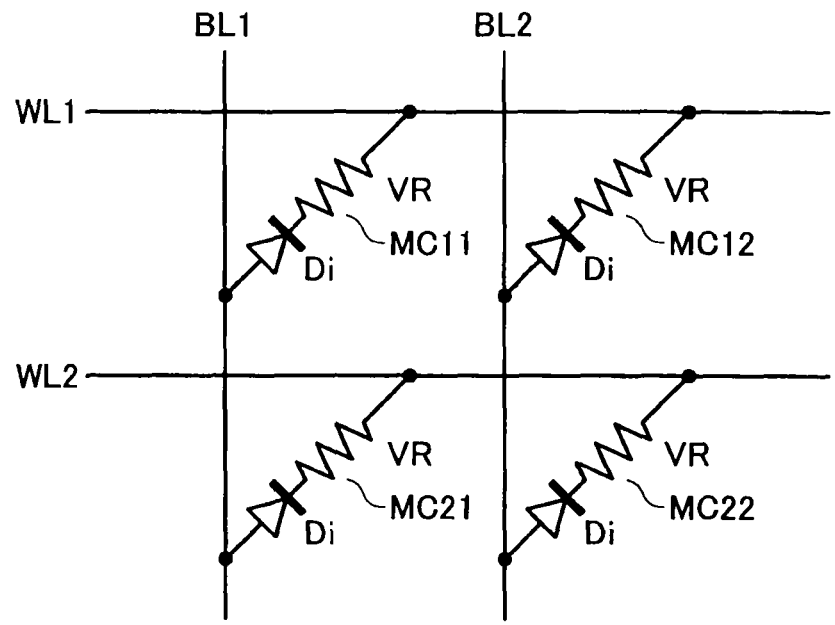
FIG. 6 shows a cell array configuration in accordance with another embodiment.
Figure 7:
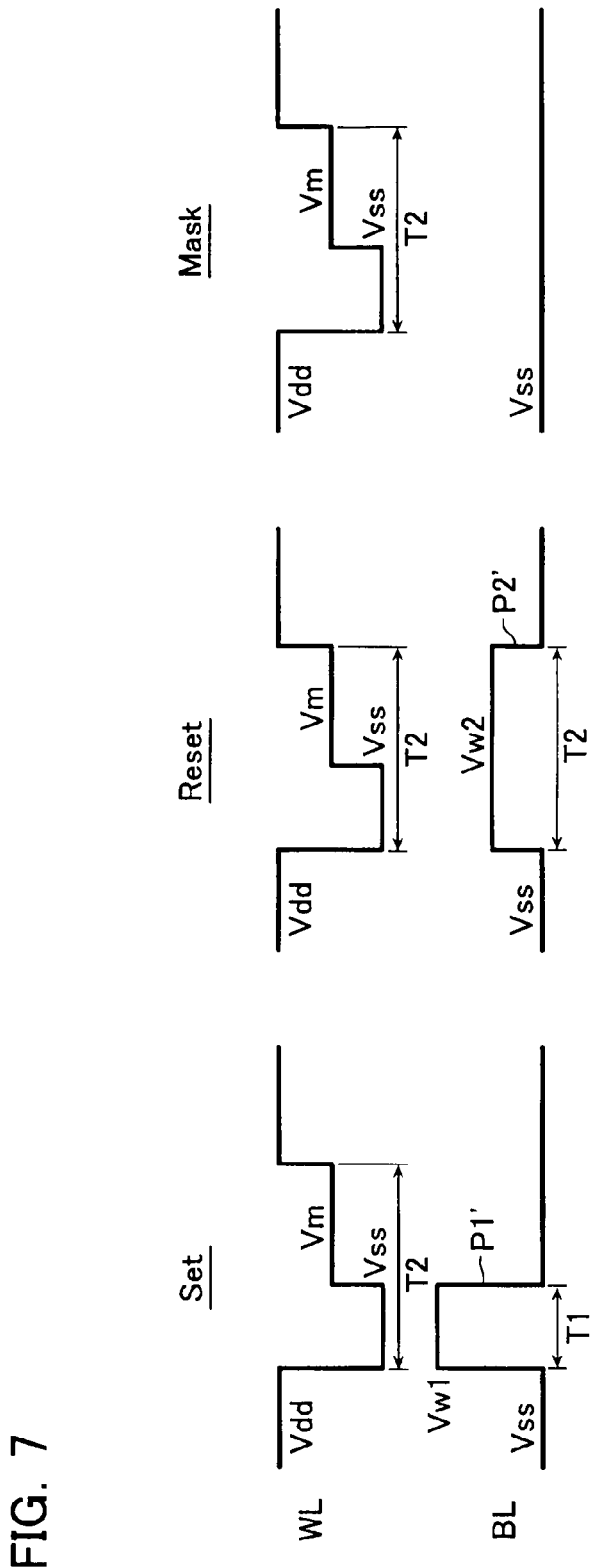
FIG. 7 shows set, reset and mask operations waveforms in the embodiment.

FIG. 6 shows another cell array arrangement, in which the diode polarity is reversed to that shown in FIG. 1. That is, in this case, when a bit line is relatively higher than a word line, a memory cell is selected at the cross-point of the word line and the bit line. In this case, voltage waveforms in the set, reset and mask modes are shown in FIG. 7 in comparison with those shown in FIG. 5.

That is, a selected word line is applied with a composite pulse composed of a negative pulse with pulse width T1, which swings from the basic level Vdd to Vss, and another negative pulse with pulse width T2, which swings from the basic level Vdd to a medium level Vm (Vdd>Vm>Vss). Bit line BL is applied with: set-use pulse P1', which is positive voltage Vw1 with pulse width T1 on the basic level Vss, in the set mode; reset-use pulse P2', which is positive voltage Vw2 with pulse width T2 on the basic level Vss, in the reset mode; and Vss in the mask mode.

As a result, multiple cells arranged along the selected word line may be subjected simultaneously to set, reset and mask modes as similar to the above-described embodiment.

Embodiment 3

Figure 8:
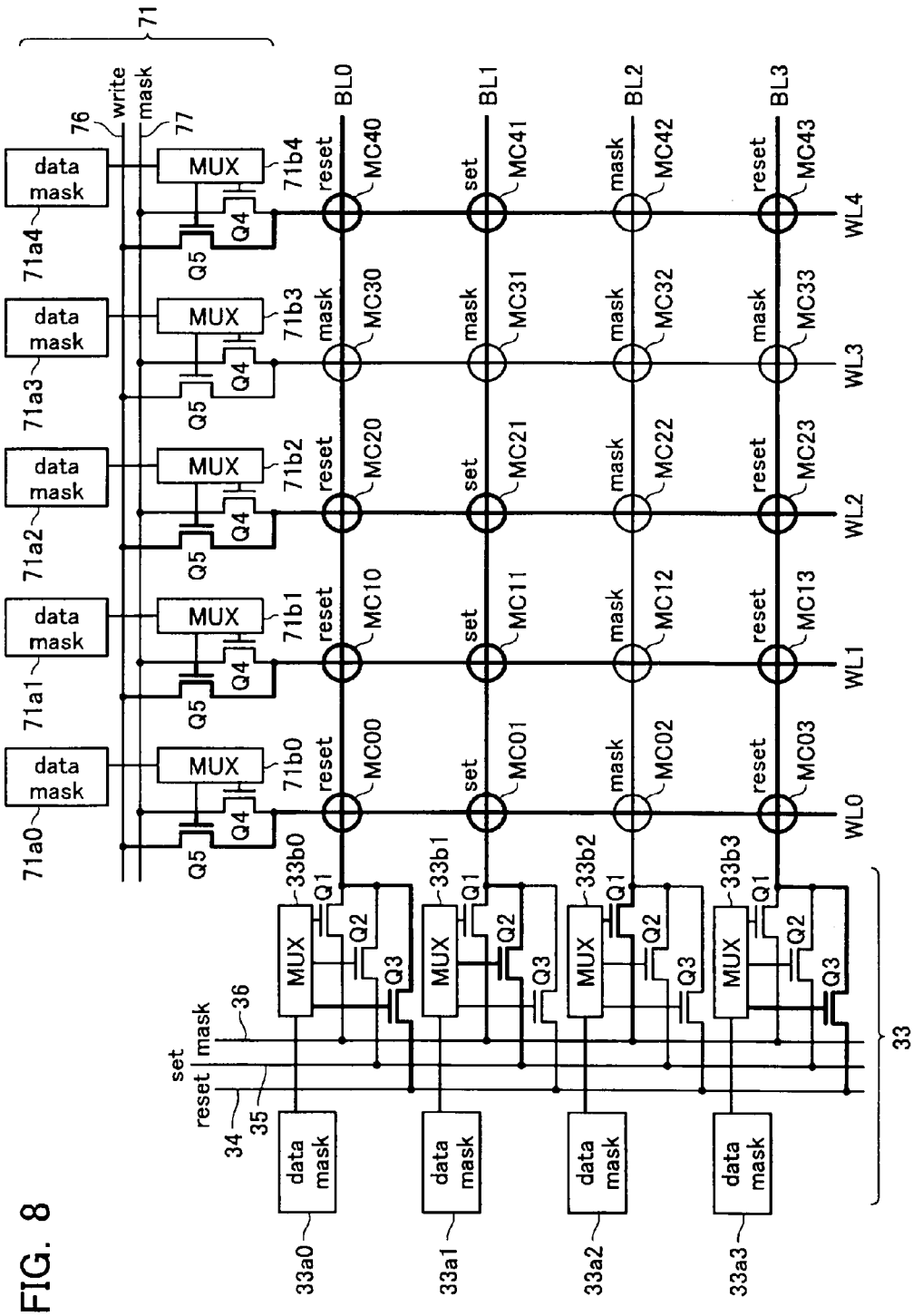
FIG. 8 shows a cell array driver circuit in another embodiment.

FIG. 8 shows another embodiment, in which it is made possible to write a certain data pattern in multiple memory cells in a two-dimensional cell array at once. The cell array configuration (i.e., diode polarity) is the same as in the embodiment 1. Word line driver circuit 71 has mode selecting circuits 71a (71a0, 71a1, . . . ) disposed for the respective word lines and multiplexers 71b (71b0, 71b1, . . . ) controlled by the mode selecting circuits 71a, as similar to the bit line driver circuit.

In detail, the mode selecting circuit 71a is for selecting data writing mode (including set and reset modes) and mask mode, and formed of a data register storing one bit data. Write-use voltage signal line 76 and mask-use voltage signal line 77 are prepared to be shared by the plural word lines, and these signal lines are selectively coupled to word lines WL via transistors Q4 or Q5 driven by the multiplexers 71b, so that write-use voltage (i.e., selecting drive voltage) and mask-use voltage (i.e., non-selecting voltage) are supplied to selected word lines and non-selected word lines, respectively.

Bit line driver circuit 33 is formed as similar to that in the embodiment 1, and has mode selecting circuits 33a, multiplexers 33, reset-, set- and mask-use signal lines 34, 35 and 36, and transistors Q1-Q3, which are driven by the multiplexers 33 to be turned on or off.

Figures 9, 10:
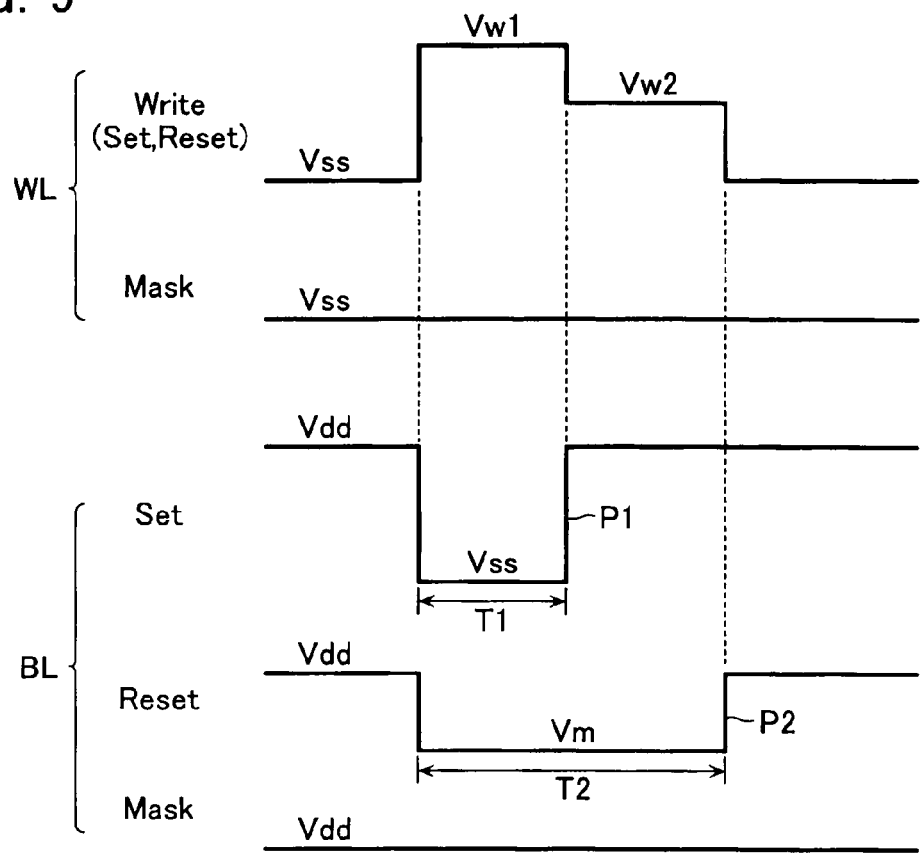
FIG. 9 shows set, reset and mask operations waveforms in the embodiment.
FIG. 10 shows an operation mode selecting state with the word line and the bit line in the embodiment.

FIG. 9 shows voltage waveforms applied to word line WL and bit line BL. On the word line side, when a write mode (set or reset mode) is selected, transistor Q5 becomes on, so that a selected word line is applied with a composite pulse composed of set-use positive pulse voltage Vw1 with pulse width T1 and reset-use positive pulse voltage Vw2 (<Vw1) with pulse width T2 (>T1). With respect to a mask mode selected word line, transistor Q4 is turned on, and Vss is applied to the word line. Except that plural word lines are set simultaneously in the set, reset and mask modes simultaneously, voltage level and pulse width setting is the same as in the embodiment 1.

By contrast, on the bit line side, bit lines are applied with the similar voltages as in the embodiment 1 in accordance with modes, as follows: negative pulse voltage P1 (pulse width T1), which swings to Vss from the basic level Vdd, is applied in the set mode; negative pulse voltage P2 (pulse width T2), which swings to medium level Vm from the basic level Vdd, in the reset mode; and Vss in the mask mode.

Like in the embodiment 1, in case a selected word line is in the write mode ("write"), and a selected bit line is in the set mode ("set"), the selected memory cell is applied with pulse voltage Vw1 for time T1 and subjected to the set operation. In case a selected word line is in the write mode ("write"), and a selected bit line is in the reset mode ("reset"), the selected memory cell is applied with pulse voltage in the range of (Vw1−Vm)~(Vw2−Vm) for time T2 and subjected to the reset operation.

In case a word line is kept at Vss in the mask mode, or a bit line is kept at Vdd in the mask mode, memory cells arranged on the word line and the bit line are in the mask mode, in which cell's states are kept as it is, because the cell's voltage condition is insufficient for a set or a reset operation.

FIG. 10 shows the above-described mode states selected with word line WL and bit line BL.

In the detailed example shown in FIG. 8, word lines WL0, WL1, WL2 and WL4 are in the write mode while word line WL3 is in the mask mode. In addition, bit lines BL0, BL3 are in the reset mode; bit line BL1 in the set mode; and bit line BL2 in the mask mode. In this case, all cells arranged along the word line WL3 are in the mask mode, and all cells arranged along the bit line BL2 are also in the mask mode. Excepting these cells set in the mask mode, memory cells arranged on the bit lines BL0 and BL3 selected in the reset mode are set in the reset mode while memory cells arranged on the bit line BL1 selected in the set mode are set in the set mode.

As described above, according to this embodiment, setting plural word lines in a write state, it becomes possible to subject plural memory cells selected by each word line to the set, reset and mask operations in accordance with bit line selection modes. Explaining in other words, it becomes possible to write the same data in the plural memory cells disposed on a bit line and selected by different word lines.

Therefore, this embodiment is effective, for example, in such a case that a ReRAM is subjected to a test with a test data pattern such as all "0", all "1", a checker pattern and the like.

This invention is not limited to the above-described embodiment. It will be understood by those skilled in the art that various changes in form and detail may be made without departing from the spirit, scope, and teaching of the invention.

What is claimed is:

1. A resistance change memory device comprising:
   a cell array including a plurality of first lines disposed in parallel, a plurality of second lines disposed to cross the first lines and a resistance change type of memory cells disposed at the cross-points of the first lines and the second lines, the resistance value of the memory cell being changed between a set state and a reset state;
   a first line driver circuit configured to select one of a set-use pulse voltage, a reset-use pulse voltage and a mask-use voltage and supply the selected voltages to the respective first lines; and
   a second line driver circuit configured to select at least one of the second lines and supply a second line drive pulse voltage to it, wherein
   the memory cell is changed from the reset state into the set state under the condition that the set-use pulse voltage and the second line drive pulse voltage are applied simultaneously, and changed from the set state into the reset state under the condition that the reset-use pulse voltage and the second line drive pulse voltage are applied simultaneously, while the memory cell is kept in the present state under the condition that the mask-use pulse voltage and the second line drive pulse voltage are applied simultaneously.

2. The resistance change memory device according to claim 1, wherein
   the first line driver circuit comprises:
   first voltage signal lines disposed to be shared by the first lines, and generate the set-use pulse voltage, the reset-use pulse voltage and the mask-use voltage used for keeping a memory cell in the present resistance value state; and
   first multiplexers disposed for the respective first lines, the first multiplexer selecting one of the first voltage signal lines and supplying one of the set-use pulse voltage, the reset-use pulse voltage and the mask-use voltage to the first line.

3. The resistance change memory device according to claim 2, wherein
   the first line driver circuit further comprises:
   three transistors disposed for the respective first lines and between the first signal voltage lines and the first line, respectively, the three transistors being driven by the first multiplexer to connect one of the first signal voltage lines to the first line.

4. The resistance change memory device according to claim 2,
   the first line driver circuit further comprises:
   data registers disposed for the respective first lines to store write data and controlling the first multiplexers.

5. The resistance change memory device according to claim 1, wherein
   the set-use pulse voltage has a first pulse width and a first pulse height while the reset-use pulse voltage has a second pulse width longer than the first pulse width and a second pulse height lower than the first pulse height.

6. The resistance change memory device according to claim 1, wherein
   the second line driver circuit comprises:
   second voltage signal lines disposed to be shared by the second lines, and generate two kinds of voltages, the second line drive pulse voltage and a non-selecting voltage to be supplied to a non-selected second line; and
   second multiplexers disposed for the respective second lines, the second multiplexer selecting one of the second voltage signal lines and supplying one of the two kinds of voltages to a second line.

7. The resistance change memory device according to claim 6, wherein
   the second line driver circuit further comprises:
   two transistors disposed for the respective second lines and between the second signal voltage lines and the second line, respectively, the two transistors being driven by the second multiplexer to connect one of the second signal voltage lines to the second line.

8. The resistance change memory device according to claim 1,
   the second line driver circuit further comprises:
   mode selecting circuit disposed for the respective second lines to control the second multiplexer.

9. The resistance change memory device according to claim 6, wherein
   the second line drive pulse voltage is a step-shaped voltage composed of a first drive pulse voltage and a second drive pulse voltage, wherein
   the first drive pulse voltage has a third pulse width and a third pulse height while the second drive pulse voltage has a fourth pulse width longer than the third pulse voltage and a fourth pulse height lower than the third pulse height.

10. The resistance change memory device according to claim 1, wherein
    a plurality of the cell arrays are three-dimensionally stacked.

* * * * *